United States Patent
Kurokawa

(10) Patent No.: US 9,509,314 B2
(45) Date of Patent: Nov. 29, 2016

(54) METHOD FOR OPERATING PROGRAMMABLE LOGIC DEVICE

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/641,579

(22) Filed: Mar. 9, 2015

(65) Prior Publication Data

US 2015/0263735 A1    Sep. 17, 2015

(30) Foreign Application Priority Data

Mar. 13, 2014 (JP) .................. 2014-049710
Mar. 13, 2014 (JP) .................. 2014-049711

(51) Int. Cl.
*H03K 19/177* (2006.01)

(52) U.S. Cl.
CPC .... *H03K 19/17776* (2013.01); *H03K 19/1776* (2013.01)

(58) Field of Classification Search
CPC .................. H03K 19/1776; H03K 19/17776
See application file for complete search history.

(56) References Cited

U.S. PATENT DOCUMENTS

| | | |
|---|---|---|
| 4,609,986 A | 9/1986 | Hartmann et al. |
| 4,642,487 A | 2/1987 | Carter |
| 4,870,302 A | 9/1989 | Freeman |
| 5,343,406 A | 8/1994 | Freeman et al. |
| 5,352,940 A | 10/1994 | Watson |
| 5,432,719 A | 7/1995 | Freeman et al. |
| 5,488,316 A | 1/1996 | Freeman et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Jason M Crawford
*Assistant Examiner* — Kurtis R Bahr
(74) *Attorney, Agent, or Firm* — Fish & Richardson P.C.

(57) ABSTRACT

In a multi-context PLD (dynamically reconfigurable circuit), at the tune of rewriting configuration data on a non-selected context during circuit operation, configuration data is stably stored. At the time of rewriting configuration data on a non-selected context, writing to a row which is to be rewritten continues until input signals supplied to input terminals of routing switches in the row become "L" all that time or the input signals become "L" at least once. More specifically, a write selection signal for the row continues to be output. In addition, while the write selection signal is being output, loading of configuration data into a driver circuit is not conducted, or loading of configuration data into a driver circuit is conducted but storage thereof in a line buffer is not conducted.

12 Claims, 9 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,808,942 A | 9/1998 | Sharpe-Geisler |
| 6,057,704 A | 5/2000 | New et al. |
| 6,127,702 A | 10/2000 | Yamazaki et al. |
| 6,172,521 B1 | 1/2001 | Motomura |
| 6,294,274 B1 | 9/2001 | Kawazoe et al. |
| 6,535,422 B2 | 3/2003 | Goto et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,084,665 B1 | 8/2006 | Lewis et al. |
| 7,098,689 B1 | 8/2006 | Tuan et al. |
| 7,105,868 B2 | 9/2006 | Nause et al. |
| 7,196,942 B2 | 3/2007 | Khurana et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,797,664 B2 | 9/2010 | Matsumoto et al. |
| 8,072,237 B1 | 12/2011 | Rahim et al. |
| 8,248,101 B2 | 8/2012 | Voogel et al. |
| 8,547,753 B2 | 10/2013 | Takemura et al. |
| 9,007,093 B2 | 4/2015 | Kurokawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0300201 A1 | 12/2007 | Matsumoto et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0243652 A1 | 10/2009 | Dorairaj et al. |
| 2009/0278122 A1 | 11/2009 | Hosono et al. |
| 2009/0280600 A1 | 11/2009 | Hosono et al. |
| 2010/0039138 A1 | 2/2010 | Bertin |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0101351 A1 | 5/2011 | Yamazaki |
| 2011/0175646 A1 | 7/2011 | Takemura et al. |
| 2012/0212995 A1 | 8/2012 | Kurokawa |
| 2012/0293200 A1 | 11/2012 | Takemura |
| 2012/0293201 A1 | 11/2012 | Fujita et al. |
| 2012/0293202 A1* | 11/2012 | Nishijima ......... H03K 19/1776 326/41 |
| 2012/0293206 A1* | 11/2012 | Yoneda ............ H03K 19/17736 326/101 |
| 2012/0293209 A1 | 11/2012 | Takewaki |
| 2012/0293242 A1 | 11/2012 | Kato |
| 2013/0207170 A1 | 8/2013 | Kurokawa |
| 2013/0285697 A1 | 10/2013 | Kurokawa |
| 2013/0285698 A1 | 10/2013 | Fukutome |
| 2013/0286757 A1 | 10/2013 | Takemura |
| 2013/0293262 A1 | 11/2013 | Takemura |
| 2013/0293263 A1 | 11/2013 | Kurokawa |
| 2013/0314124 A1 | 11/2013 | Ikeda et al. |
| 2013/0321025 A1 | 12/2013 | Kurokawa et al. |
| 2014/0159771 A1 | 6/2014 | Ikeda et al. |
| 2014/0225644 A1* | 8/2014 | Aoki ................ H03K 19/1776 326/41 |
| 2015/0008958 A1* | 1/2015 | Kurokawa ..... H03K 19/018521 326/41 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-285014 A | 10/1998 |
| JP | 11-505377 | 5/1999 |
| JP | 2000-044236 A | 2/2000 |
| JP | 2000-150900 A | 5/2000 |
| JP | 2002-076356 A | 3/2002 |

(56) References Cited

FOREIGN PATENT DOCUMENTS

| JP | 2002-289859 A | 10/2002 | | |
| --- | --- | --- | --- | --- |
| JP | 2003-086000 A | 3/2003 | | |
| JP | 2003-086808 A | 3/2003 | | |
| JP | 2004-103957 A | 4/2004 | | |
| JP | 2004-273614 A | 9/2004 | | |
| JP | 2004-273732 A | 9/2004 | | |
| JP | 2013-141214 | * | 7/2013 | ..... H03K 19/018521 |
| JP | 2013-251894 A | 12/2013 | | |
| WO | WO-2004/114391 | 12/2004 | | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)m (m=7, 8, 9, and 16) in the In2O3—ZnGa2O4—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Naito.T et al., "World's first monolithic 3D-FPGA with TFT SRAM over 90nm 9 layer Cu CMOS", 2010 Symposium on VLSI Technology : Digest of Technical Papers, Jun. 15, 2010, pp. 219-220.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Song.I et al., "Short Channel Characteristics of Gallium—Indium—Zinc—Oxide Thin Film Transistors for Three-Dimensional Stacking Memory", IEEE Electron Device Letters, Jun. 1, 2008, vol. 29, No. 6, pp. 549-552.

Matsuzaki.T et al., "1Mb Non-Volatile Random Access Memory Using Oxide Semiconductor", IMW 2011 (3rd IEEE International Memory Workshop), May 22, 2011, pp. 185-188.

Chun.K et al., "A 3T Gain Cell Embedded DRAM Utilizing Preferential Boosting for High Density and Low Power On-Die Caches", IEEE Journal of Solid-State Circuits, Jun. 1, 2011, vol. 46, No. 6, pp. 1495-1505.

Eslami.F et al., "Capacitive Boosting for FPGA Interconnection Networks", 21st International Conference on Field Programmable Logic and Applications, 2011, vol. 21, pp. 453-458.

Kozuma.M et al., "Crystalline In—Ga—Zn—O FET-based Configuration Memory for Multi-Context Field-Programmable Gate Array Realizing Fine-Grained Power Gating", SSDM 2013 (Extended Abstracts of the 2013 International Conference on Solid State Devices and Materials), Sep. 24, 2013, pp. 1096-1097.

\* cited by examiner

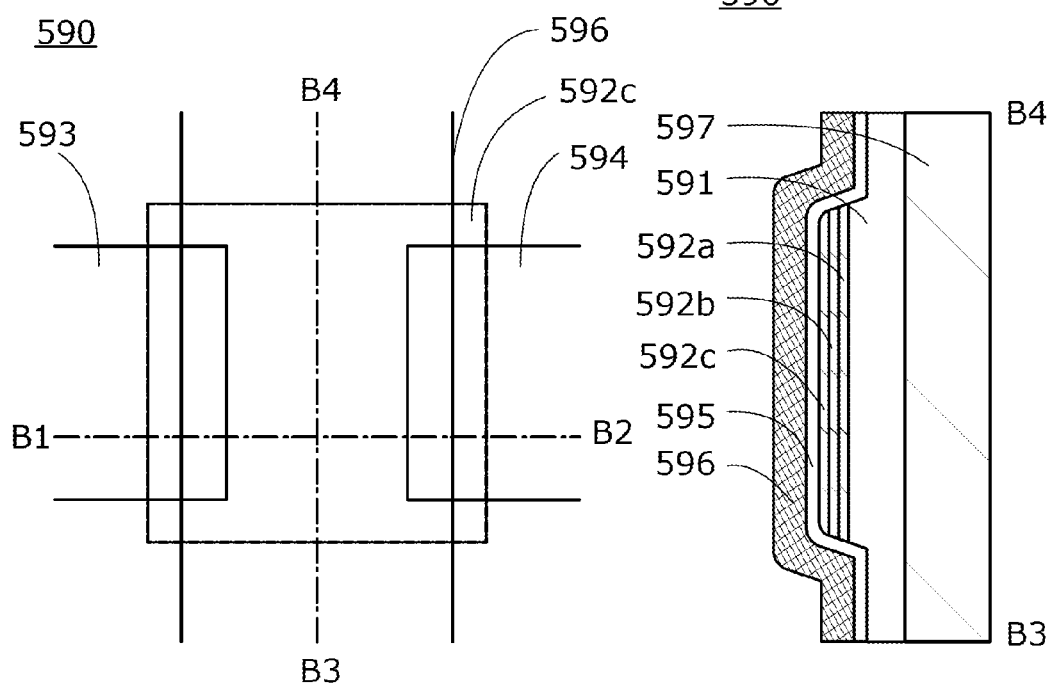
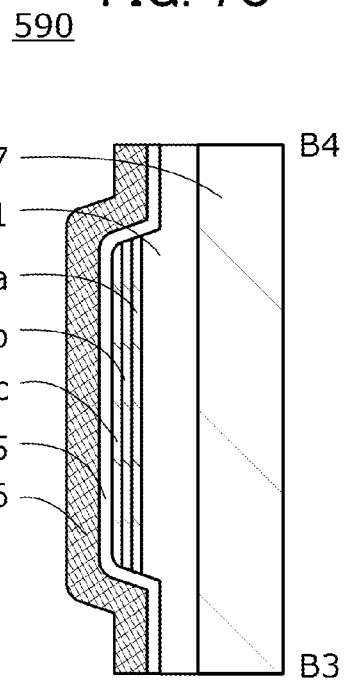
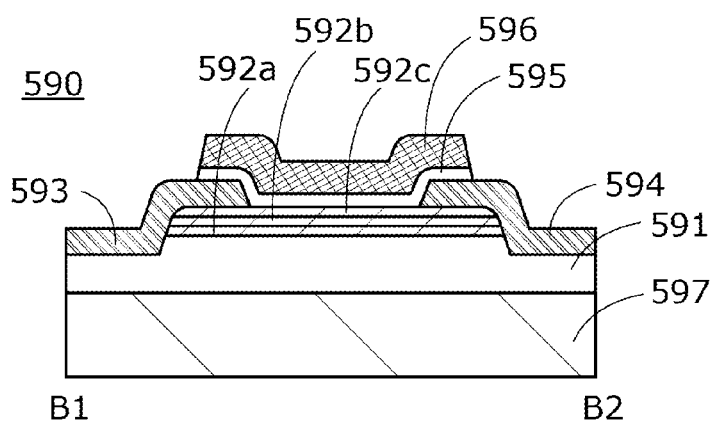

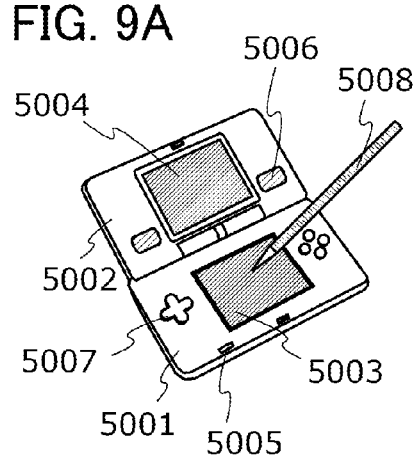
FIG. 9A
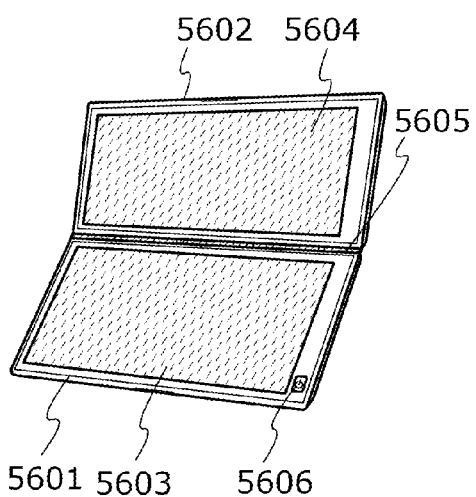
FIG. 9B
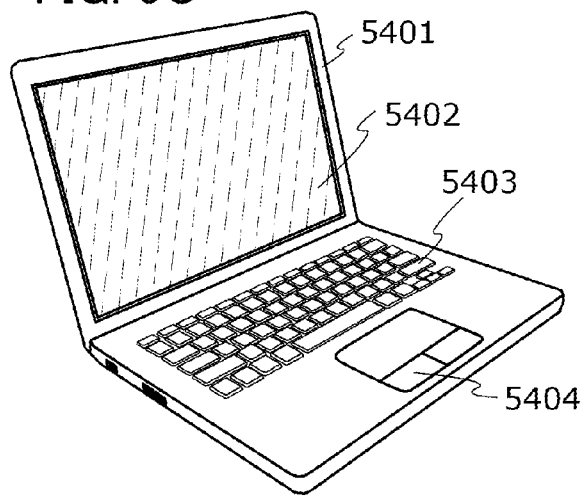
FIG. 9C
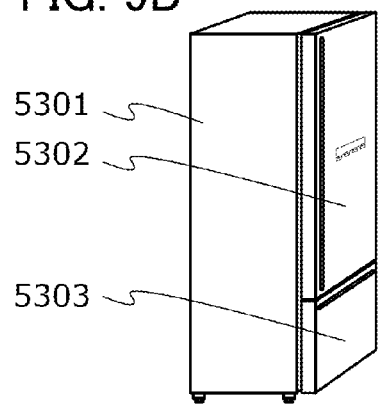
FIG. 9D
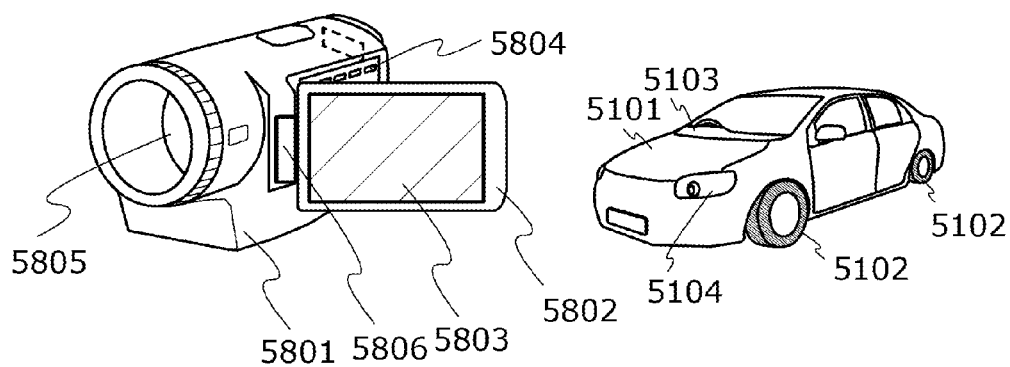
FIG. 9E
FIG. 9F

METHOD FOR OPERATING PROGRAMMABLE LOGIC DEVICE

BACKGROUND OF THE INVENTION

1. Field of the Invention

The present invention relates to an object, a method, or a manufacturing method. In addition, the present invention relates to a process, a machine, manufacture, or a composition of matter. For example, the present invention relates to a semiconductor device, a driving method thereof, or the like. For example, the present invention relates to a programmable logic device, a reconfigurable circuit, a driving method thereof, or the like. Specifically, the present invention relates to a semiconductor device including a dynamically reconfigurable circuit, a driving method thereof, or the like.

2. Description of the Related Art

Unlike a normal integrated circuit in which all circuits are fixed at the time of manufacture, a programmable logic device (PLD) is a device that can function with an intended circuit configuration set by a user at the time of actual use after shipment. Examples of such devices that are programmable by users are a small-scale programmable array logic (PAL) and generic array logic (GAL) and a large-scale complex programmable logic device (CPLD) and field programmable gate array (FPGA); in this specification, such devices are collectively called a programmable logic device (hereinafter referred to as PLD).

PLDs have advantages such as a short development period and flexibility in changing design specifications over conventional application specific integrated circuits (ASICs). Thus, the use of PLDs for semiconductor devices has been promoted in recent years.

A PLD is composed of, for example, a plurality of programmable logic elements (also referred to as logic blocks) and wirings between the programmable logic elements. A function of the PLD can be changed by changing a function of the programmable logic elements. Moreover, a function of the PLD can be changed by changing an electrical connection state between programmable logic elements.

The programmable logic element is composed of a lookup table (LUT) and a multiplexer, for example. A function of the programmable logic element can be specified by setting a given value in a memory element that stores data of the lookup table. Further, a function of the programmable logic element can be specified by setting a given value in a memory element that stores information on selection of signals input to the multiplexer.

The wirings between the programmable logic elements are constituted using, for example, a connection switch capable of controlling connections between a plurality of wirings and a plurality of wirings. The electrical connection state of the wirings between the programmable logic elements can be specified by setting a given value in a memory element that stores data on the on/off state of the connection switch.

Information including the data of a lookup table, the information on selection of signals input to a multiplexer, and the data on the on/off state of a connection switch is referred to as configuration data. A memory element storing configuration data is referred to as a configuration memory. Setting configuration data in a configuration memory is called "configuration". In particular, setting new configuration data (updating configuration data) in a configuration memory is called "reconfiguration". The circuit configuration of the PLD can be changed in response to a user's request by producing (programming) intended configuration data and performing configuration.

The PLD generally performs configuration (static configuration) while the operation of a semiconductor device including the PLD is stopped. In contrast, to further exploit the features of the PLD, a technique of performing configuration (dynamic configuration) while the semiconductor device operates has attracted attention. Specifically, a plurality of pieces of configuration data corresponding to a plurality of circuit configurations (contexts) are prepared, and circuit functions are switched. Such a PLD can be called a multi-context PLD.

For dynamic configuration in Patent Document 1, each piece of configuration data corresponding to a plurality of circuit configurations is stored at a different address in a dynamic random access memory (DRAM), and a configuration memory is composed of a static random access memory (SRAM). Patent Document 1 suggests a method of performing configuration in a short time by reading configuration data on an intended circuit configuration from the address of the DRAM and writing the configuration data into the SRAM, which is the configuration memory.

However, with the configuration disclosed in Patent Document 1, regular refresh operation is required to maintain configuration data in the DRAM, and the power consumption is increased as a result. Since the DRAM is a volatile memory, it is necessary to store data in the DRAM every time the PLD is powered on. For this reason, a nonvolatile memory is needed to store configuration data. In addition, a step of transferring a large volume of data from the nonvolatile memory to the DRAM is required every time the PLD is powered on; thus, the startup time is increased.

When an SRAM is used as the configuration memory, at least four transistors are required, which leads to a significant increase in the number of elements in the entire PLD and an increase in the circuit area.

In contrast, in Patent Document 2, the present inventor suggests a PLD (reconfigurable circuit) in which a nonvolatile memory including a transistor with extremely low off-state current (hereinafter referred to as an OS transistor) as a component (such a nonvolatile memory is hereinafter referred to as an OS memory) is used as a configuration memory.

The OS memory stores configuration data by controlling the amount of charge at a storage node with the OS transistor. With this structure, charge can be held, and a nonvolatile memory can be easily achieved.

The use of the OS memory as a configuration memory and also as a routing switch makes it possible to configure a switch with a small number of transistors. This makes it easy to decrease the area of a configuration memory and increase the degree of integration of the configuration memory.

Accordingly, it becomes easy to configure a multi-context PLD (dynamically reconfigurable circuit) in which configuration data can be rewritten during operation.

Furthermore, the use of the OS memory makes it possible to increase the switching speed of a routing switch (also referred to as a path transistor) by a boosting effect during circuit operation.

REFERENCES

[Patent Document 1] Japanese Published Patent Application No. H10-285014

[Patent Document 2] Japanese Published Patent Application No. 2013-251894

SUMMARY OF THE INVENTION

Since the off-state current of the OS transistor is extremely low, the amount of charge at a storage node can be kept fir a sufficiently long time. Therefore, the OS memory can have a small or no storage capacitance. Since the storage capacitance of the storage node can be small, the boosting effect is more easily exerted.

However, in a multi-context PLD (dynamically reconfigurable circuit), when "H" (also referred to as high, high potential, "1", or the like) is input to an input terminal of a routing switch, i.e., when "H" is input to a source of a path transistor included in a routing switch, a sufficient "H" potential is not written to the OS memory in some cases at the time of rewriting configuration data on a non-selected context during circuit operation.

In order to utilize the boosting effect in the routing switch during circuit operation as described above, it is effective to decrease a storage capacitance that is added to a gate of the path transistor. However, in the case of rewriting configuration data on a non-selected context, the gate potential is stepped up by the boosting effect, and this causes a problem in that sufficient charge cannot be stored at the storage node.

In view of this, an object of one embodiment of the present invention is to stably store configuration data in an OS memory. Another object of one embodiment of the present invention is to provide a novel semiconductor device. Note that the description of these objects does not disturb the existence of other objects. Note that in one embodiment of the present invention, there is no need to achieve all the objects. Other objects will be apparent from and can be derived from the description of the specification, the drawings, the claims, and the like.

In one embodiment of the present invention, at the time of rewriting configuration data on a non-selected context, writing to a row which is to be rewritten continues until input signals supplied to input terminals of routing switches in the row become "L" (hereinafter also referred to as low, low potential, "0", or the like) all that time or the input signals become "L" at least once. More specifically, a write selection signal for the row continues to be output. In addition, while the write selection signal is being output, loading of configuration data into a driver circuit or storage thereof in a line buffer of the driver circuit may be stopped.

One embodiment of the present invention is a method for operating a programmable logic device. The programmable logic device includes a first signal line, a second signal line, and a programmable switch. The programmable switch includes a first transistor and a second transistor. One of a source and a drain of the first transistor is electrically connected to a gate of the second transistor. A channel formation region of the first transistor includes an oxide semiconductor. The second signal line is electrically connected to one of a source and a drain of the second transistor. The first signal line is electrically connected to a gate of the first transistor. When a signal is input to the gate of the second transistor through the first transistor, a signal for the first signal line is kept at a high level (hereinafter also referred to as High or H level) until a signal for the second signal line becomes a low level (hereinafter also referred to as Low or L level) at least once.

One embodiment of the present invention is a method for operating a programmable logic device. The programmable logic device includes a first signal line, a second signal line, and a programmable switch. The programmable switch includes a first transistor and a second transistor. One of a source and a drain of the first transistor is electrically connected to a gate of the second transistor. A channel formation region of the first transistor includes an oxide semiconductor. The second signal line is electrically connected to one of a source and a drain of the second transistor. The first signal line is electrically connected to a gate of the first transistor. When a signal is input to the gate of the second transistor through the first transistor and a signal for the second signal line does not become a low level even once within a first time, the second signal line is forcibly set at the low level.

In one embodiment of the present invention, in the case where t-th configuration data is rewritten during operation with a first circuit configuration (context), the first time may be set by dividing the time to the next operation with the t-th circuit configuration (context) by the number of rows to be rewritten.

One embodiment of the present invention is a method for operating a programmable logic device. The programmable logic device includes a first signal line, a second signal line, and a programmable switch. The programmable switch includes a first transistor and a second transistor. One of a source and a drain of the first transistor is electrically connected to a gate of the second transistor. A channel formation region of the first transistor includes an oxide semiconductor. The second signal line is electrically connected to one of a source and a drain of the second transistor. The first signal line is electrically connected to a gate of the first transistor. When a signal is input to the gate of the second transistor through the first transistor, a signal for the first signal line is kept at a high level until the total time that a signal for the second signal line is at a low level exceeds a second time.

In one embodiment of the present invention, the second time may be set to a time to store charge to the amount at which the first transistor is not turned on even when the second signal line is set at a high level or even when a high level potential is input to the gate of the first transistor after the charge is stored.

In one embodiment of the present invention, the programmable logic device may include a driver circuit. The driver circuit includes a data signal line, a first latch circuit, and a second latch circuit. The first latch circuit has a function of receiving a signal from the data signal line. The second latch circuit has a function of receiving a signal from the first latch circuit. The second latch circuit has a function of outputting the signal from the first latch circuit to the gate of the second transistor through the first transistor. After the signal for the first signal line is set at the high level, the function of the second latch circuit of receiving the signal from the first latch circuit is stopped.

One embodiment of the present invention may include a driver circuit. The driver circuit includes a data signal line, a first latch circuit, and a second latch circuit. The first latch circuit has a function of receiving a signal from the data signal line. The second latch circuit has a function of receiving a signal from the first latch circuit. The second latch circuit has a function of outputting the signal from the first latch circuit to the gate of the second transistor through the first transistor. After the signal for the first signal line is set at the high level, the function of the second latch circuit of receiving the signal from the first latch circuit is stopped, and the signal from the data signal line is received by the first latch circuit.

In one embodiment of the present invention, the programmable logic device may include a logic element. The programmable switch may have a function of controlling electrical connection between the second signal line and the logic element.

One embodiment of the present invention is a method for operating a programmable logic device. The programmable logic device includes a plurality of first signal lines, a plurality of second signal lines, and a plurality of programmable switches. Each of the plurality of programmable switches includes a first transistor and a second transistor. One of a source and a drain of the first transistor is electrically connected to a gate of the second transistor. A channel formation region of the first transistor includes an oxide semiconductor. One of the plurality of second signal lines is electrically connected to one of a source and a drain of the second transistor. One of the plurality of first signal lines is electrically connected to a gate of the first transistor. When a signal is input to the gate of the second transistor through the first transistor, a signal for the first signal line is kept at a high level until all signals for the plurality of second signal lines become a low level at least once.

In one embodiment of the present invention, the programmable logic device may include a plurality of logic elements. The plurality of programmable switches may have a function of controlling electrical connection between the plurality of second signal lines and the plurality of logic elements.

According to one embodiment of the present invention, in rewriting configuration data during operation of a PLD (dynamically reconfigurable circuit), configuration data can be stably stored in an OS memory, whereby the reliability of operation of the PLD (dynamically reconfigurable circuit) can be improved. Alternatively, a novel semiconductor device or the like can be provided. Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

FIGS. 7A to 7C illustrate a structure of a transistor.
FIGS. 9A to 9F each illustrate an electronic device.

DETAILED DESCRIPTION OF THE INVENTION

Figure 1:
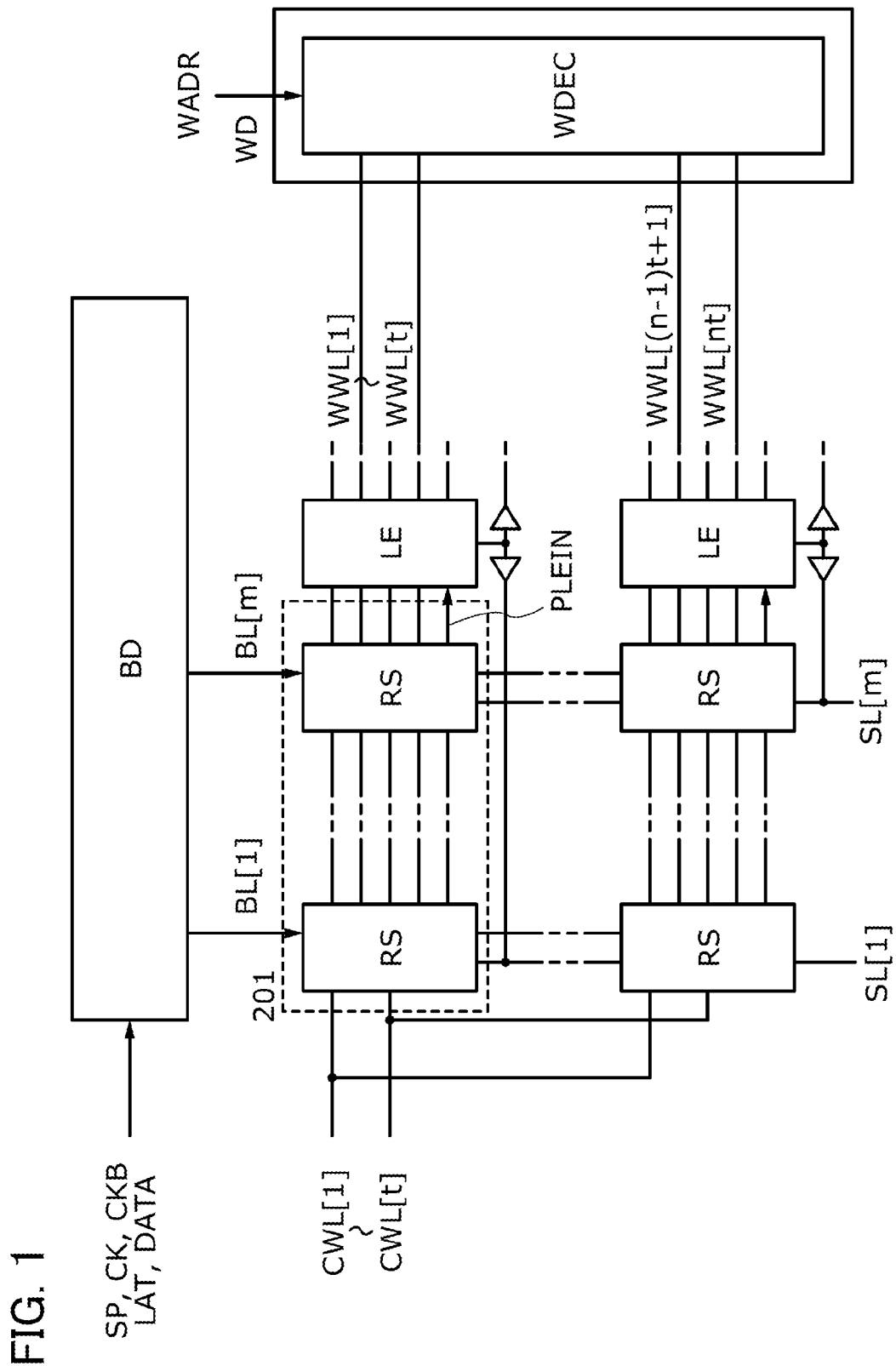
FIG. 1 illustrates a partial configuration of a PLD.

Embodiments of the present invention will be described in detail below with reference to drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as the ordinal numbers used to specify one embodiment of the present invention.

Note that the term "connection" in this specification includes an electrically connected circuit configuration. For example, the expression "a terminal and a wiring are connected" indicates a circuit configuration in which a terminal and a wiring are electrically connected, and it does not exclude a configuration in which some elements are provided between the terminal and the wiring. The term "electrically connected" or "electrical connection" includes the case where components are connected through an object having any electric function. There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Note that a semiconductor device according to the present invention includes, in its category, a variety of semiconductor integrated circuits formed using semiconductor elements, such as microprocessors, image processing circuits, controllers for semiconductor display devices, digital signal processors (DSP), and microcontrollers. A semiconductor device of the present invention includes, in its category, a variety of devices such as semiconductor display devices and radio-frequency integrated circuits (RFIC) formed using any of the above semiconductor integrated circuits. The semiconductor display device includes, in its category, liquid crystal display devices, light-emitting devices in which a light-emitting element typified by an organic light-emitting element (OLED) is provided in each pixel, electronic paper, digital micromirror devices (DMD), plasma display panels (PDP), field emission displays (FED), and other semiconductor display devices in which semiconductor elements are included in driver circuits.

Embodiment 1

In this embodiment, one embodiment of a PLD (dynamically reconfigurable circuit) will be described with reference to FIGS. 1 to 4.

Figure 2:
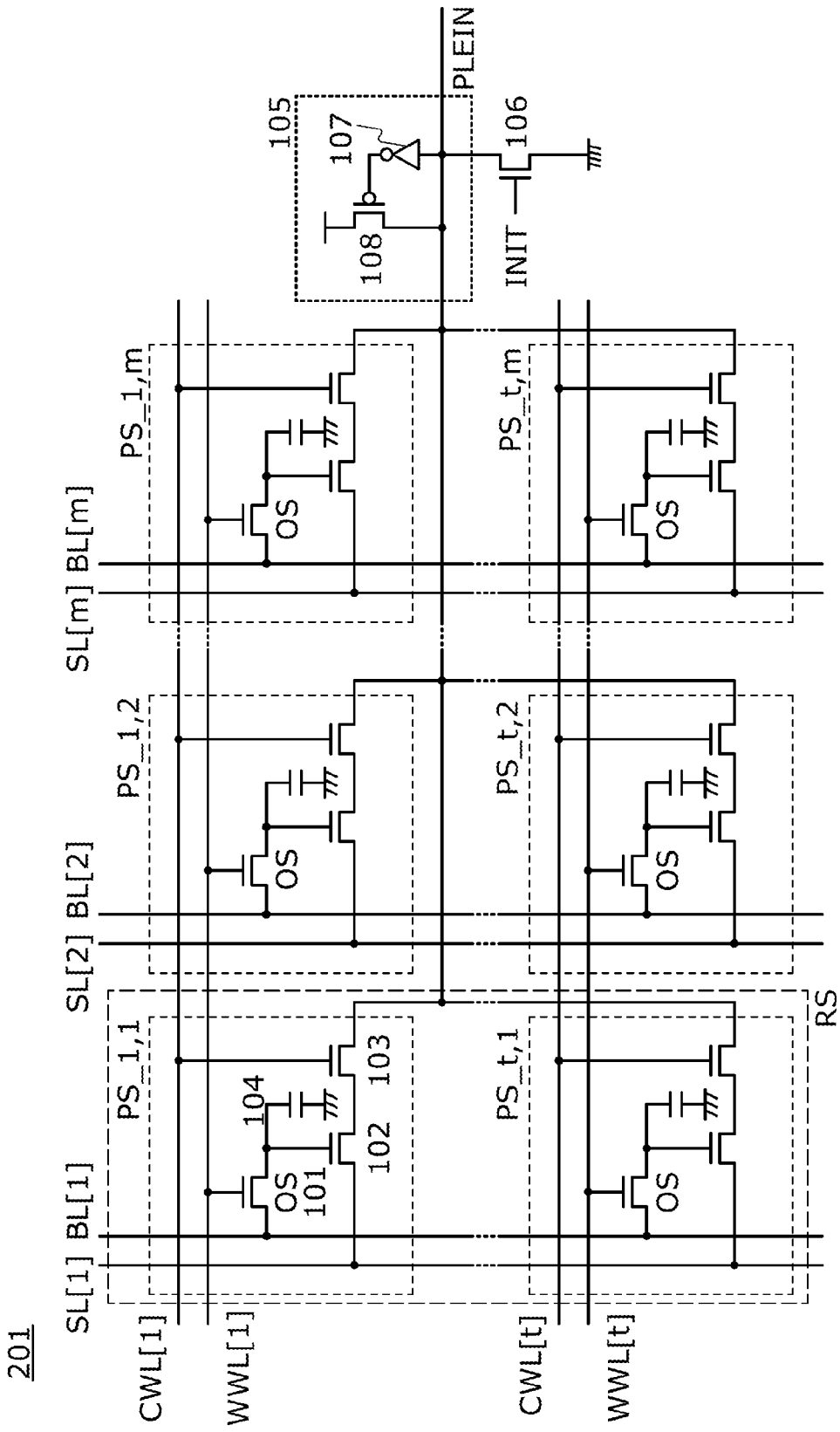
FIG. 2 illustrates a specific circuit configuration.

FIG. 1 illustrates an example of a configuration of a PLD (dynamically reconfigurable circuit) in a processor. FIG. 1 is a schematic diagram showing some of components arranged in a matrix in a PLD (dynamically reconfigurable circuit) which is capable of having t contexts. FIG. 2 illustrates a circuit configuration in a region corresponding to a component 201 with switch groups in FIG. 1. In FIG. 1, the PLD (dynamically reconfigurable circuit) includes programmable logic elements LE, switch groups RS corresponding to t sets of configuration data, a driver circuit BD, and a driver circuit WD.

The programmable logic elements LE include configuration memories, flip-flops, and the like. By changing configuration data to be stored in a configuration memory, an output signal in response to an input signal of a corresponding programmable logic element can be changed to a given logic.

The switch groups RS includes configuration memories, switches, and the like. By changing configuration data to be stored in configuration memories, electrical connection between programmable logic elements or between a programmable logic element and an input and output pin (not illustrated) can be changed.

Note that the t contexts correspond to the t sets of configuration data. One of the t sets is selected by a selection signal supplied from one of signal lines CWL[1] to CWL[t], and a configuration of the PLD (dynamically reconfigurable circuit) is determined according to the corresponding configuration data. In FIG. 1, programmable switches corresponding to the t sets of configuration data are denoted by a switch group RS, and n rows and m columns of switch groups RS are provided. That is, in FIG. 1, the plurality of switch groups RS include (t×n (rows)×m (columns)) configuration memories.

Note that the circuit configuration of the programmable logic element LE can be changed by changing configuration data to be stored in the configuration memory inside the programmable logic element LE. That is, the PLD (dynamically reconfigurable circuit) can change the circuit configuration inside the programmable logic elements and electrical connection between the programmable logic elements by changing configuration data, and can thus have a given circuit configuration.

The driver circuit BD has a function of outputting configuration data to the configuration memories. The driver circuit WD includes a decoder circuit WDEC and can generate a signal for selecting one of rat rows of configuration memories from a signal supplied from a signal line WADR. Note that the driver circuit WD may include a shift register to sequentially generate signals for selecting one of the nt rows of configuration memories. Configuration data output from the driver circuit BD may be collectively written to the configuration memories in the selected row. The configuration memories store data supplied from signal lines BL.

FIG. 2 illustrates a component with switch groups each including a plurality of programmable switches PS (corresponding to the component 201 in FIG. 1). Here are shown m columns of switch groups RS each corresponding to the t sets of configuration data. Programmable switches PS_1,1 to PS_t,m each include an OS transistor 101, a transistor 102, a transistor 103, and a storage capacitor 104. Note that the capacitance of the storage capacitor can be set as appropriate depending on required specifications such as configuration data holding time and switch response speed. When a small capacitance is required, the storage capacitor can be constituted by parasitic capacitance between wirings without being provided intentionally.

In FIG. 2, signal lines SL[1] to SL[m] are connected to output signal lines of programmable logic elements LE, and a signal line PLEIN is connected to an input signal line of one of the programmable logic elements LE. Furthermore, the programmable switches PS_1,1 to PS_t,m have a function of controlling electrical connection between the signal lines SL[1] to SL[m] and the signal line PLEIN. More specifically, the electrical connection between the signal lines SL[1] to SL[m] and the signal line PLEIN is determined according to configuration data stored in the programmable switches PS_1,1 to PS_t,m selected via the signal lines CWL[1] to CWL[t].

The programmable switches PS_1,1 to PS_t,m selected via signal lines WWL[1] to WWL[t] store data supplied to the signal lines BL[1] to BL[m].

The signal line PLEIN is electrically connected to a latch circuit 105 and a reset circuit 106. The latch circuit 105 includes an inverter 107 and a transistor 108 and has a function of holding a potential of the signal line PLEIN.

Here, the OS transistor 101 includes, in a channel formation region, a semiconductor material whose band gap is wider than that of silicon and whose intrinsic carrier density is lower than that of silicon. When such a semiconductor material is included in a channel formation region, a transistor with extremely low off-state current can be obtained. Examples of such a semiconductor material are an oxide semiconductor, silicon carbide, gallium nitride, and the like that each have a band gap approximately three times as wide as that of silicon. A transistor including the above semiconductor material can have much lower off state current than a transistor formed using a normal semiconductor material such as silicon or germanium.

Figure 3:
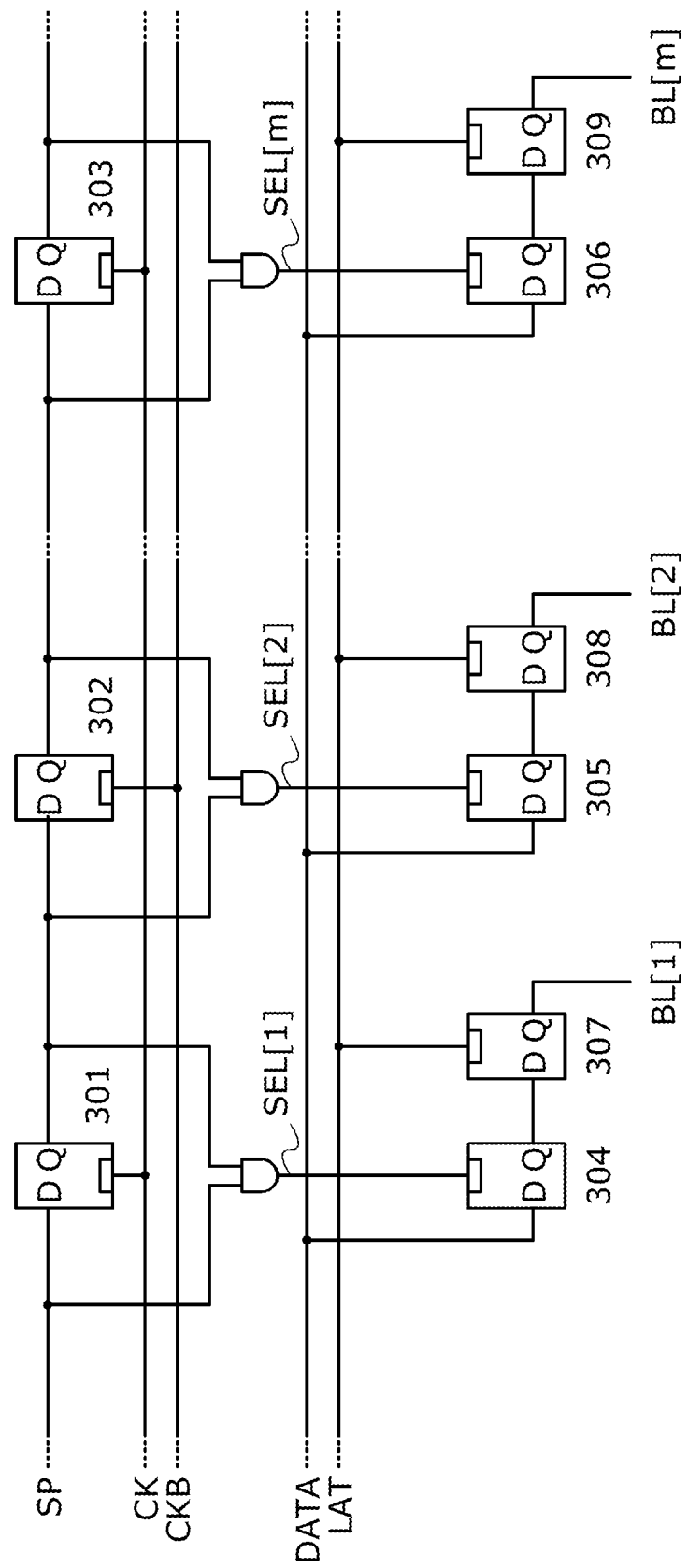
FIG. 3 illustrates a configuration of a driver circuit BD.

FIG. 3 illustrates a configuration of the driver circuit BD. Here, the driver circuit BD includes a shift register including latch circuits 301 to 303, latch circuits 304 to 306, a line buffer including latch circuits 307 to 309, and the like. Although omitted in FIG. 3 and in this embodiment, a plurality of latch circuits are provided between the latch circuit 302 and the latch circuit 303, and all the latch circuits are electrically connected in series by a signal line SP. The number of the latch circuits 301 to 303 is m which is equal to the number of columns of the switch groups RS. In addition, between the latch circuits 305 and 308 connected in series and the latch circuits 306 and 309 connected in series, a plurality of latch circuits connected similarly are provided, which are electrically connected to a signal line DATA and a signal line LAT. The total number of the latch circuits 304 to 306 and the latch circuits 307 to 309 is 2 m because two latch circuits are electrically connected in series to each column of switch groups RS.

The shift register is controlled by a clock signal supplied from a clock signal line CK, an inverted clock signal supplied from an inverted clock signal line CKB, and a start pulse supplied from the signal line SP, and has a function of sequentially supplying column selection signals to signal lines SEL[1] to SEL[m].

The latch circuits 304 to 306 have a function of sequentially storing serial data supplied from the signal line DATA in latch circuits in columns which are sequentially selected for data writing via the signal lines SEL[1] to SEL[m].

The line buffer has a function of collectively storing data that are stored in the latch circuits 304 to 306 in accordance with a signal supplied from the signal line LAT and outputting the data to the corresponding signal lines BL[1] to BL[m].

Figure 4:
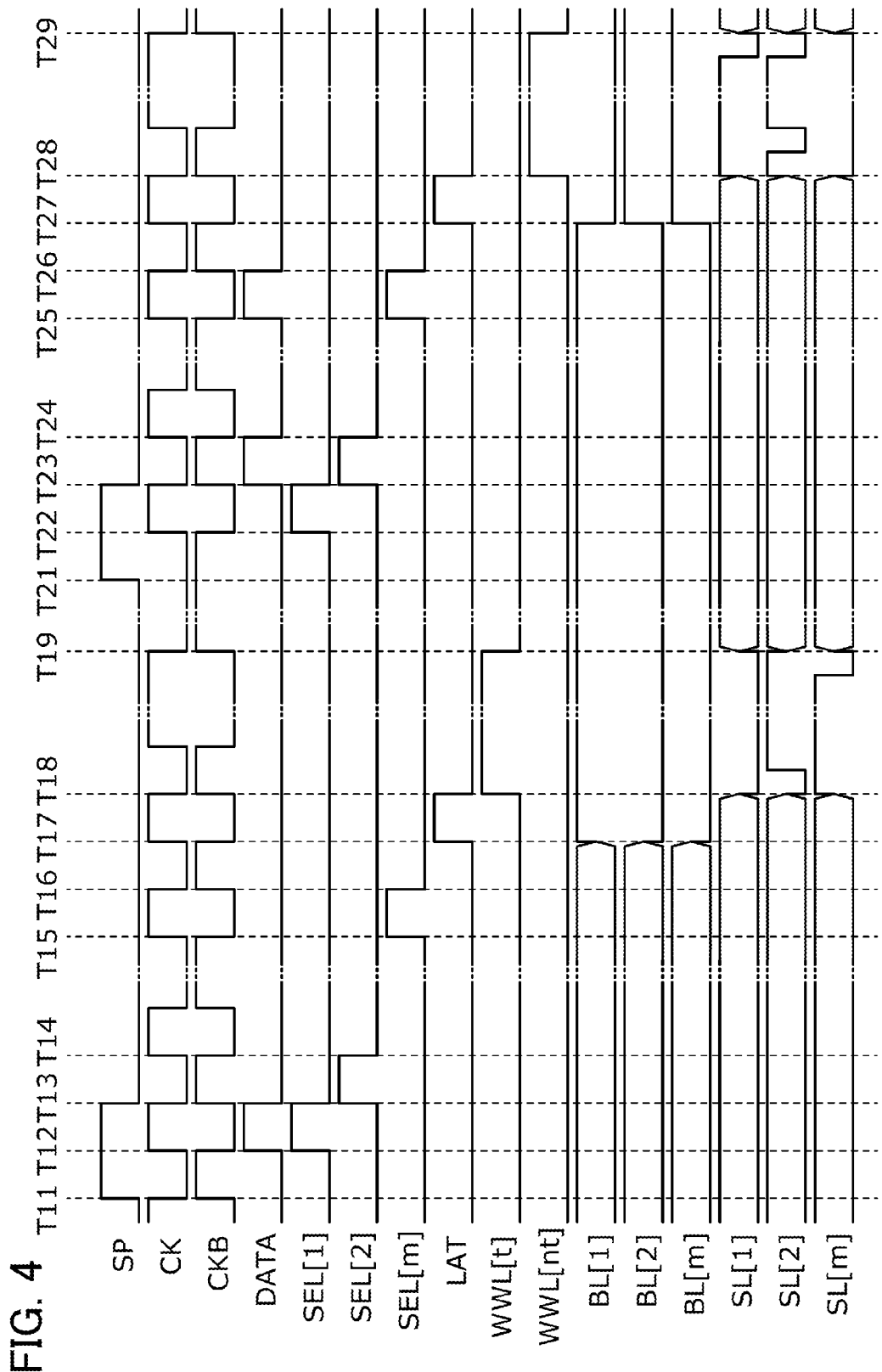
FIG. 4 is a timing chart illustrating a write operation.

FIG. 4 is a timing chart illustrating an operation of writing configuration data in the PLD (dynamically reconfigurable circuit).

Here, it is assumed that the PLD (dynamically reconfigurable circuit) is in operation. That is, a case is considered in which the t-th configuration data is rewritten in a state where the PLD (dynamically reconfigurable circuit) operates with the first circuit configuration (context) among the t contexts.

In a period from time T11 to time T13, the signal line SP is set at "H". Thus, the signal line SEL[1] is set at "H" in a period from time T12 to time T13, the signal line SEL[2] is set at "H" in a period from time T13 to time T14, and the signal line SEL[m] is set at "H" in a period from time T15 to time T16. The value of the signal line DATA in the period from time T12 to time T13, that in the period from time T13 to time T14, and that in the period from time T15 to time T16 are set to "H", "L", and "L", respectively, and these values of the signal line DATA are stored in the latch circuit 304, the latch circuit 305, and the latch circuit 306, respectively. Note that in order to supply the signal in FIG. 4 to the signal line SP, it is effective to provide an additional latch circuit which is controlled by the inverted clock signal CKB in the previous stage of the latch circuit 301, thereby generating a signal corresponding to the above signal.

In a period from time T17 to time T18, the signal line LAT is set at "H". At this time, data of the latch circuits 304 to 306 are stored in the latch circuits 307 to 309 and are, at the same time, output to the signal lines BL[1] to BL[m]. That is, the signal line BL[1] is set at "H", the signal line BL[2] is set at "L", and the signal line BL[m] is set at "L".

In a period from time T18 to time T19, the signal line WWL[t] is set at "H". At this time, configuration memories in a row corresponding to the signal line WWL[t] are selected for data writing, and "H", "L", and "L" are stored in the configuration memories corresponding to the signal line BL[1], the signal line BL[2], and the signal line BL[m], respectively.

Here, the signal line WWL[t] is kept at "H" until the signal lines SL[1] to SL[m] of the programmable switches PS_t,1 to PS_t,m become "L" at least once. The signal lines SL[1] to SL[m] correspond to signal lines which supply output signals of programmable logic elements LE. Therefore, in other words, the signal line WWL[t] is kept at "H" until the output signals of the programmable logic elements LE become "L" at least once.

In a period from time T21 to time T23, the signal line SP is set at "H". Thus, the signal line SEL[1] is set at "H" in a period from time T22 to time T23, the signal line SEL[2] is set at "H" in a period from time T23 to time T24, and the signal line SEL[m] is set at "H" in a period from time T25 to time T26. The value of the signal line DATA in the period from time T22 to time T23, that in the period from time T23 to time T24, and that in the period from time T25 to time T26 are set to "L", "H", and "H", respectively, and these values of the signal line DATA are stored in the latch circuit 304, the latch circuit 305, and the latch circuit 306, respectively.

In a period from time T27 to time T28, the signal line LAT is set at "H". At this time, data of the latch circuits 304 to 306 are stored in the latch circuits 307 to 309 and are, at the same time, output to the signal lines BL[1] to BL[m]. That is, the signal line BL[1] is set at "L", the signal line BL[2] is set at "H", and the signal line BL[m] is set at "H".

In a period from time T28 to time T29, the signal line WWL[nt] is set at "H". At this time, configuration memories in a row corresponding to the signal line WWL[nt] are selected for data writing, and "L", "H", and "H" are stored in the configuration memories corresponding to the signal line BL[1], the signal line BL[2], and the signal line BL[m], respectively.

Here, the signal line WWL[nt] is kept at "H" until the signal lines SL[1] to SL[m] of the programmable switches PS_nt,1 to PS_nt,m become "L" at least once. The signal lines SL[1] to SL[m] correspond to signal lines which supply output signals of programmable logic elements LE. Therefore, in other words, the output signals of the programmable logic elements LE are monitored, and the signal line WWL[nt] is kept at "H" until the signal lines SL[1] to SL[m] become "L" at least once.

That is, a determination circuit for determining whether the signal lines SL[1] to SL[m] become "L" all that time or whether the signal lines SL[1] to SL[m] become "L" at least once may be provided in FIG. 1. Alternatively, a determination circuit for determining whether the signal lines SL[1] to SL[m] become "L" at least once by monitoring the output signals of the programmable logic elements LE may be provided in FIG. 1. The output of the driver circuit WD may be controlled by a determination by the determination circuit.

In the case where the OS transistor 101 in the programmable switch PS_t,1 in FIG. 2 is turned on to input "H" data and the signal line SL[1] connected to the transistor 102 is set at "H", sufficient charge cannot be stored because the potential of the gate of the transistor 102 is increased by a bootstrap effect. When the signal line SL[1] is set at "L", the bootstrap effect is weakened, and sufficient charge can be stored. Even when the signal line SL[1] is set at "H" after sufficient charge is once stored, the potential of a gate of the transistor 102 is increased by the bootstrap effect. Therefore, even when the potential "H" is input to a gate of the OS transistor 101, the OS transistor 101 is not turned on, so that the charge is retained.

Accordingly, in rewriting configuration data during operation of a PLD (dynamically reconfigurable circuit), configuration data can be stably stored in an OS memory, whereby the reliability of operation of the PLD (dynamically reconfigurable circuit) can be improved.

Embodiment 2

In this embodiment, operations of the driver circuit BD will be described. Note that the driver circuit BD operates in two ways, each of which will be described.

(1) In a period where a selection signal for a row selected for configuration data writing (a signal supplied to the signal line WWL[t] or the signal line WWL[nt]) is "H" (in the period from time T18 to time T19 or in the period from time T28 to time T29), data cannot be written to configuration memories in the other rows. Therefore, in that period, loading of configuration data into the driver circuit BD may be stopped by stopping the clock signal CK and the inverted clock signal CKB.

That is, at the time when the signal lines SL[1] to SL[m] become "L" at least once, the clock signal CK and the inverted clock signal CKB are supplied again to resume the loading of configuration data into the driver circuit BD. Accordingly, data can be stably stored in the configuration memories without stopping the operation of the PLD (dynamically reconfigurable circuit). In addition, power consumption can be reduced by stopping the clock signal.

(2) Regardless of whether the signal lines SL[1] to SL[m] become "L" at least once in the period where the selection signal for the row selected for configuration data writing (the signal supplied to the signal line WWL[t] or the signal line WWL[nt]) is "H" (in the period from time T18 to time T19 or in the period from time T28 to time T29), part of the operation of the driver circuit BD, i.e., loading of configuration data into the latch circuits 304 to 306 can be conducted.

In that case, when the signal lines SL[1] to SL[m] become "L" at least once in the previous write operation by the time immediately before the latch signal LAT is set at "H", i.e., immediately before time T17 (time T27) in FIG. 4, the operation after time T17 (time T27), i.e., the operation of setting the latch signal LAT to "H" is conducted. When at least one of the signal lines SL[1] to SL[m] does not become "L" even once in the previous write operation, the latch signal LAT is kept at "L" and the clock signal CK and the inverted clock signal CKB are stopped until the signal lines SL[1] to SL[m] become "L" at least once.

That is, the operation in the period from time T16 to time T17 (the period from time T26 to time T27) in FIG. 4 is extended. Accordingly, the time between one write operation and the next can be shortened and efficient writing can be achieved by conducting loading of configuration data into the latch circuits 304 to 306 without stopping the operation of the PLD (dynamically reconfigurable circuit).

Accordingly, in rewriting configuration data during operation of a PLD (dynamically reconfigurable circuit), configuration data can be stably stored in an OS memory, whereby the reliability of operation of the PLD (dynamically reconfigurable circuit) can be improved. In addition, power consumption can be reduced by stopping the clock signal. In the operation (2), the time between one write operation and the next can be shortened and efficient writing can be achieved.

This embodiment can be implemented in appropriate combinations with any of the other embodiments.

Embodiment 3

In this embodiment, an operation performed when a limit is set on time for rewriting configuration data will be described.

In the case where standby time of the driver circuit BD exceeds a predetermined time, i.e., in the case where at least one of the signal lines SL[1] to SL[m] does not become "L" even once within the predetermined time, or in the case where the total time required for rewriting configuration data exceeds the predetermined time, for example, it is effective to forcibly set the signal lines SL[1] to SL[m] at "L", i.e., forcibly set the output signals of the programmable logic elements LE to "L". In that case, it is effective to provide a circuit for holding the output signal of the programmable logic element LE, such as a flip-flop, provide an AND circuit or the like having one of inputs supplied with an output signal of the flip-flop, use an output signal of the AND circuit as the output signal of the programmable logic element LE, and forcibly set the output signal of the programmable logic elements LE to "L" in accordance with a control signal which is supplied to the other input of the AND circuit. At that time, it is effective to set a write control signal for the flip-flop inactive in order to prevent rewriting of data held by the flip-flop. Accordingly, the length of stop of the PLD operation can be minimized, and data can be stably stored in the configuration memories.

The predetermined time may be set as follows. For example, in the case where t-th configuration data is rewritten during operation with the first circuit configuration (context) in the operation (1) in Embodiment 2, the predetermined time may be set by subtracting the time required for the driver circuit BD to load data for the m columns into the latch circuits 304 to 306 from the time obtained by dividing the time to the next operation with the t-th circuit configuration (context) by the number of rows to be rewritten.

For example, in the case where the t-th configuration data is rewritten during operation with the first circuit configuration (context) in the operation (2) in Embodiment 2, the predetermined time may be set by dividing the time to the next operation with the t-th circuit configuration (context) by the number of rows to be rewritten. In another example, the predetermined time may be set to the time required for the driver circuit BD to load data for the m columns into the latch circuits 304 to 306.

This embodiment can be implemented in appropriate combinations with any of the other embodiments.

Embodiment 4

In this embodiment, an operation performed when the operation frequency of the PLD (dynamically reconfigurable circuit) is high will be described.

When the operation frequency of the PLD (dynamically reconfigurable circuit) is high, there may be cases where the signal lines SL[1] to SL[m] become "L" at least once but are not at "L" for a period sufficient for data writing to configuration memories, such as a case where the signal lines SL[1] to SL[m] become "L" for only one clock. Therefore, it is effective to monitor whether the total time that the signal lines SL[1] to SL[m] are at "L" reaches the time required for data writing to configuration memories, whether the total number of clocks where the signal lines SL[1] to SL[m] are at "L" reaches the required number of clocks, or the like, and to stop the loading of configuration data into the driver circuit BD until the signal lines SL[1] to SL[m] are at "L" for a sufficient period, or to conduct the loading of configuration data into the latch circuits 304 to 306 and keep the latch signal LAT at "L" for standby. Accordingly, configuration data can be stably written to the configuration memories without stopping the operation of the PLD (dynamically reconfigurable circuit).

In addition, a determination circuit for determining whether the signal lines SL[1] to SL[m] are at "L" for the time required for data writing to configuration memories or whether the signal lines SL[1] to SL[m] are at "L" for the required number of clocks may be provided in FIG. 1. The output of the driver circuit WD may be controlled by a determination by the determination circuit.

The time required for writing may be set to, for example, the time to store charge to the amount at which the OS transistor 101 is not turned on even when the signal line SL[1] is set at "H" or even when the potential "H" is input to the gate of the OS transistor 101 after the charge is stored.

This embodiment can be implemented in appropriate combinations with any of the other embodiments.

Embodiment 5

Here, a boosting effect will be described. In a switch included in a routing resource of a general PLD, an n-channel transistor is used in order to increase integration density. The switch, however, has a problem of reduction in switching speed because the potential of a signal passing through a gate of the n-channel transistor is lowered due to the threshold voltage.

However, in the programmable switch PS_1,1 including the OS transistor with extremely low off-state current as a component as in FIG. 2, when the OS transistor 101 is off, the gate of the transistor 102 becomes floating and highly insulated from other electrodes or wirings, so that a boosting effect described below can be obtained.

Specifically, when the gate of the transistor 102 in the programmable switch PS_1,1 is floating, the potential of the gate of the transistor 102 is increased by a capacitance Cgs generated between the source and the gate of the transistor 102 serving as a switch, as the potential of the signal line SL[1] changes from a low level to a high level.

The increase in the potential of the gate of the transistor 102 depends on the logical value of a potential input to the gate of the transistor 102. Specifically, when the potential of data input to the programmable switch PS_1,1 corresponds to a logical value of "L", the transistor is in a weak inversion mode; thus, the capacitance Cgs that contributes to an increase in the potential of the gate of the transistor 102 includes a capacitance Cos that is independent of the potential of the gate electrode, that is, the potential of the gate of the transistor 102. Specifically, the capacitance Cos includes overlap capacitance generated in a region where the gate electrode and the source region overlap with each other, and parasitic capacitance generated between the gate electrode and the source electrode, for example.

Meanwhile, when the potential of data input to the programmable switch PS_ 1,1 corresponds to a logical value of "H", the transistor is in a strong inversion mode; thus, the capacitance Cgs that contributes to an increase in the potential of the gate of the transistor 102 includes, in addition to the capacitance Cos, part of a capacitance Cox generated between a channel formation region and the gate electrode. Thus, the capacitance Cgs that contributes to an increase in the potential of the gate of the transistor 102 is larger when the potential corresponds to the logical value "H" than when the potential corresponds to the logical value "L".

Consequently, the programmable switch PS_1,1 can have a larger boosting effect when the potential corresponds to the logical value "H" than when the potential corresponds to the logical value "L"; by the boosting effect, the potential of the gate of the transistor 102 is increased with a change in the potential of the signal line SL[1].

Thus, in the case where the potential of data input to the programmable switch PS_1,1 corresponds to the logical value "H", even when the potential of the gate of the transistor 102 is dropped from the potential of the signal containing the data input to the signal line B[1] by the threshold voltage of the OS transistor 101, the potential of the gate of the transistor 102 can be boosted because of the boosting effect. As a result, the transistor serving as a switch can be turned on and the switching speed of the programmable switch PS_1,1 can be increased.

Furthermore, even when the potential of the gate of the transistor 102 is increased by the boosting effect, the increase is not large enough to turn on the transistor 102 serving as a switch, and the transistor 102 can be kept off when the potential corresponds to the logical value "L".

This embodiment can be implemented in appropriate combinations with any of the other embodiments.

Embodiment 6

In this embodiment, an example of a cross-sectional structure and a fabrication method of the switch described in the foregoing embodiments, which includes the OS transistor 101 in which an oxide semiconductor is used for a channel formation region and the transistor 102 in which a single crystal silicon wafer is used for a channel formation region, will be described with reference to FIG. 5, FIGS. 6A to 6C, FIGS. 7A to 7C, and FIG. 8.

(Example of Cross-Sectional Structure of Semiconductor Device)

Figure 5:
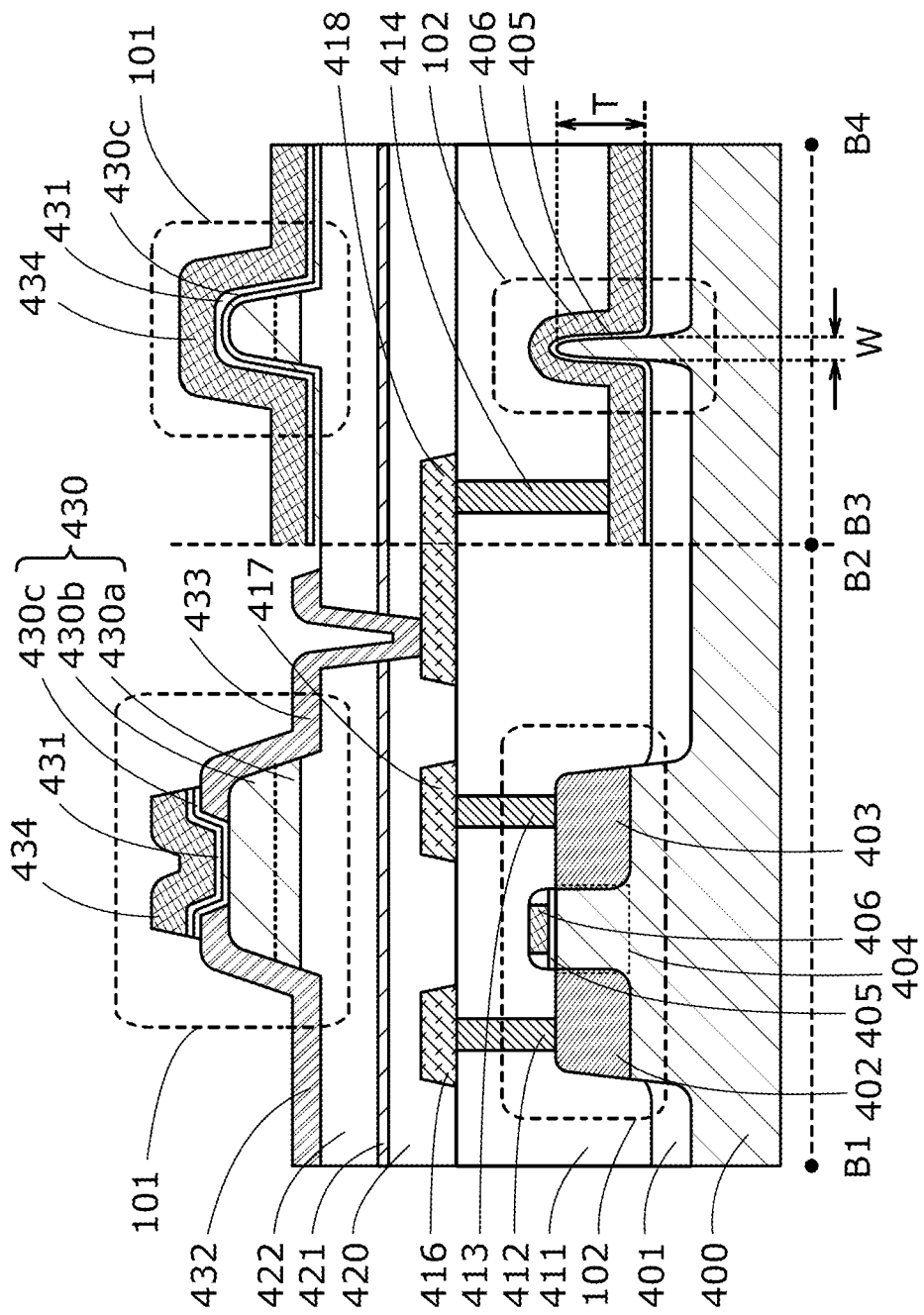
FIG. 5 illustrates a cross-sectional structure of a semiconductor device.

FIG. 5 illustrates an example of a cross-sectional structure of a semiconductor device including the programmable switch PS_1,1 in FIG. 2. A region along dashed line A1-A2 shows a structure of the OS transistor 101 and the transistor 102 in the channel length direction, and a region along dashed line A3-A4 shows a structure of the OS transistor 101 and the transistor 102 in the channel width direction. Note that in one embodiment of the present invention, the channel length direction of the OS transistor 101 is not necessarily aligned with the channel length direction of the transistor 102.

The channel length direction of a transistor refers to a direction in which a carrier moves between a source (a source region or a source electrode) and a drain (a drain region or a drain electrode), and the channel width direction refers to a direction perpendicular to the channel length direction in a plane parallel to a substrate.

In FIG. 5, the OS transistor 101 including a channel formation region in an oxide semiconductor film is formed over the transistor 102 including a channel formation region in a single crystal silicon substrate.

The transistor 102 may include the channel formation region in a semiconductor film or a semiconductor substrate of silicon, germanium, or the like in an amorphous, microcrystalline, polycrystalline, or single crystal state. Alternatively, the transistor 102 may include the channel formation region in an oxide semiconductor film or an oxide semiconductor substrate. In the case where the transistors each include a channel formation region in an oxide semiconductor film or an oxide semiconductor substrate, the OS transistor 101 is not necessarily stacked over the transistor 102, and the OS transistor 101 and the transistor 102 may be formed in the same layer.

In the case where the transistor 102 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 102 is formed can be, for example, a silicon substrate, a germanium substrate, or a silicon germanium substrate. In FIG. 5, a single crystal silicon substrate is used as the substrate 400.

The transistor 102 is electrically isolated by an element isolation method. As the element isolation method, a trench isolation method (a shallow trench isolation (STI) method) or the like can be used. FIG. 5 illustrates an example where the trench isolation method is used to electrically isolate the transistor 102. Specifically, in FIG. 5, the transistor 102 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 102 and a channel formation region 404 placed between the impurity regions 402 and 403 are provided. Further, the transistor 102 includes an insulating film 405 covering the channel formation region 404 and a gate electrode 406 that overlaps with the channel formation region 404 with the insulating film 405 provided therebetween.

In the transistor 102, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 102 can be reduced, and the number of transferred carriers in the transistor 102 can be increased. As a result, the on-state current and field-effect mobility of the transistor 102 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 102 can be further increased and the field-effect mobility of the transistor 102 can be further increased.

Note that when the transistor 102 is formed using a bulk semiconductor substrate, the aspect ratio is preferably 0.5 or more, further preferably 1 or more.

An insulating film 411 is provided over the transistor 102. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the OS transistor 101 is provided over the insulating film 422.

The OS transistor 101 includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween. Note that an opening is formed in the insulating films 420 to 422. The conductive film 433 is connected to the conductive film 418 in the opening.

Note that in FIG. 5, the OS transistor 101 includes at least the gate electrode 434 on one side of the semiconductor film 430, and may further include a gate electrode overlapping with the semiconductor film 430 with the insulating film 422 positioned therebetween.

In the case where the OS transistor 101 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 5, the OS transistor 101 has a single-gate structure where one channel formation region corresponding to one gate electrode 434 is provided. However, the OS transistor 101 may have a multi-gate structure where a plurality of electrically connected gate electrodes are provided so that a plurality of channel formation regions are included in one active layer.

FIG. 5 illustrates an example in which the semiconductor film 430 included in the OS transistor 101 includes oxide semiconductor films 430a to 430c that are stacked in this order over the insulating film 422. Note that in one embodiment of the present invention, the semiconductor film 430 of the OS transistor 101 may be formed using a single-layer metal oxide film.

(Transistor)

Next, an example of a structure of a transistor 590 that includes a channel formation region in an oxide semiconductor film is described. The transistor 590 may be used as the OS transistor 101.

Figure 6A:
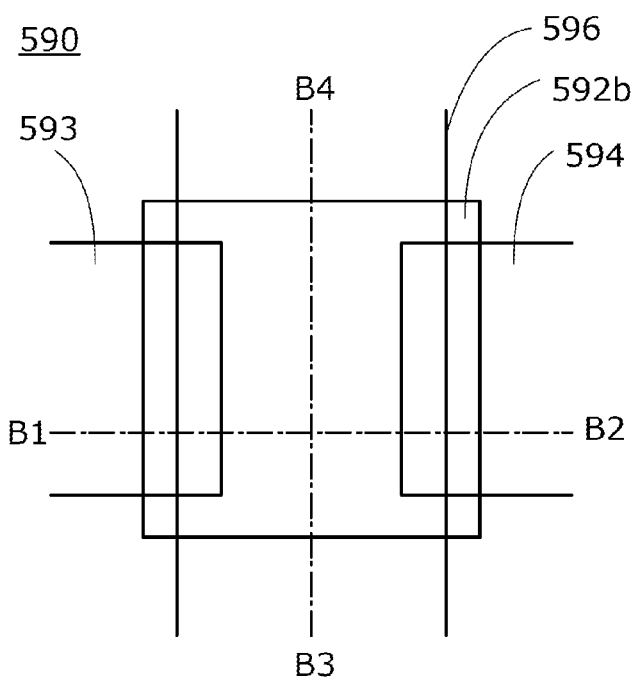
FIGS. 6A to 6C illustrate a structure of a transistor.
Figure 6C:
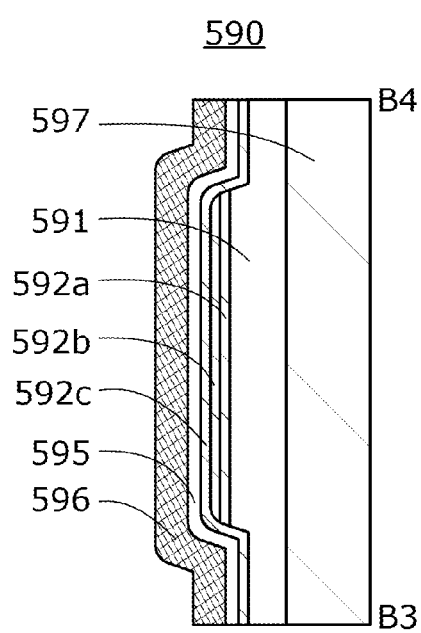
Figure 6B:
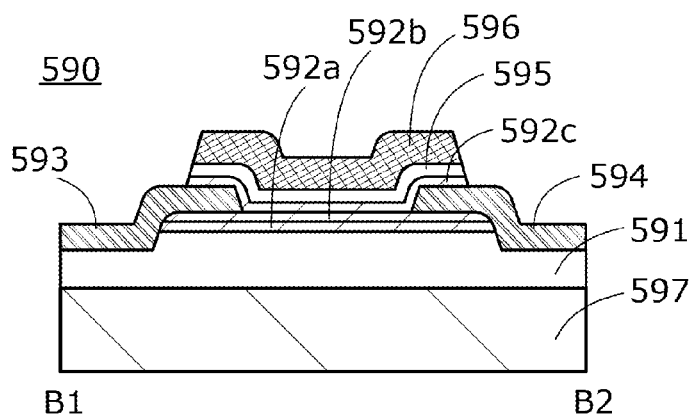

FIGS. 6A to 6C illustrate a structure of the transistor 590 that includes a channel formation region in an oxide semiconductor film as an example. FIG. 6A is a top view of the transistor 590. Note that insulating films are not illustrated in FIG. 6A in order to clarify the layout of the transistor 590. FIG. 6B is a cross-sectional view along the dashed line B1-B2 in the top view in FIG. 6A. FIG. 6C is a cross-sectional view along the dashed line B3-B4 in the top view in FIG. 6A.

As illustrated in FIGS. 6A to 6C, the transistor 590 includes an oxide semiconductor film 592a and an oxide semiconductor film 592b that are stacked in this order over an insulating film 591 formed over a substrate 597; a conductive film 593 and a conductive film 594 that are electrically connected to the oxide semiconductor film 592*b* and function as a source electrode and a drain electrode; an oxide semiconductor film 592*c* over the oxide semiconductor film 592*b*, the conductive film 593, and the conductive film 594; an insulating film 595 that functions as a gate insulating film and is located over the oxide semiconductor film 592*c*; and a conductive film 596 that functions as a gate electrode, lies over the insulating film 595, and overlaps with the oxide semiconductor films 592*a* to 592*c*. Note that the substrate 597 may be a glass substrate, a semiconductor substrate, or the like or may be an element substrate where semiconductor elements are formed over a glass substrate or on a semiconductor substrate.

FIGS. 7A to 7C illustrate another specific example of the structure of the transistor 590. FIG. 7A is a top view of the transistor 590. Note that insulating films are not illustrated in FIG. 7A in order to clarify the layout of the transistor 590. FIG. 7B is a cross-sectional view along the dashed line B1-B2 in the top view in FIG. 7A. FIG. 7C is a cross-sectional view along the dashed line B3-B4 in the top view in FIG. 7A.

As illustrated in FIGS. 7A to 7C, the transistor 590 includes the oxide semiconductor films 592*a* to 592*c* that are stacked in this order over the insulating film 591; the conductive films 593 and 594 that are electrically connected to the oxide semiconductor film 592*c* and function as a source electrode and a drain electrode; the insulating film 595 that functions as a gate insulating film and is located over the oxide semiconductor film 592*c* and the conductive films 593 and 594; and the conductive film 596 that functions as a gate electrode, lies over the insulating film 595, and overlaps with the oxide semiconductor films 592*a* to 592*c*.

FIGS. 6A to 6C and FIGS. 7A to 7C each illustrate the structural example of the transistor 590 in which the oxide semiconductor films 592*a* to 592*c* are stacked. However, the structure of the oxide semiconductor film included in the transistor 590 is not limited to a stacked-layer structure including a plurality of oxide semiconductor films and may be a single-layer structure.

In the case where the transistor 590 includes the semiconductor film in which the semiconductor films 592*a* to 592*c* are stacked in this order, each of the oxide semiconductor films 592*a* and 592*c* is an oxide film that contains at least one of metal elements contained in the oxide semiconductor film 592*b* and in which energy at the conduction band minimum is closer to the vacuum level than that in the oxide semiconductor film 592*b* is by higher than or equal to 0.05 eV, 0.07 eV, 0.1 eV, or 0.15 eV and lower than or equal to 2 eV, 1 eV, 0.5 eV, or 0.4 eV. The oxide semiconductor film 592*b* preferably contains at least indium because carrier mobility is increased.

In the case where the transistor 590 includes the semiconductor films with the above structure, when an electric field is applied to the semiconductor films by applying voltage to the gate electrode, a channel region is formed in the oxide semiconductor film 592*b*, which has the lowest conduction band minimum among the semiconductor films. That is, since the oxide semiconductor film 592*c* is provided between the oxide semiconductor film 592*b* and the insulating film 595, a channel region can be formed in the oxide semiconductor film 592*b*, which is separated from the insulating film 595.

Since the oxide semiconductor film 592*c* contains at least one of metal elements contained in the oxide semiconductor film 592*b*, interface scattering is unlikely to occur at the interface between the oxide semiconductor film 592*b* and the oxide semiconductor film 592*c*. Thus, the movement of carriers is unlikely to be inhibited at the interface, which results in an increase in the field-effect mobility of the transistor 590.

When an interface state is formed at an interface between the oxide semiconductor films 592*b* and 592*a*, a channel region is also formed in a region close to the interface; thus, the threshold voltage of the transistor 590 varies. However, since the oxide semiconductor film 592*a* contains at least one of metal elements contained in the oxide semiconductor film 592*b*, an interface state is unlikely to be formed at the interface between the oxide semiconductor film 592*b* and the oxide semiconductor film 592*a*. Accordingly, the above structure can reduce variations in electrical characteristics of the transistor 590, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 592*b* is an In-M-Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 592*b*, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 592*b* is easily formed. Typical examples of the atomic ratio of the metal elements of the target are In:M:Zn=1:1:1 and In:M:Zn=3:1:2.

Specifically, in the case where the oxide semiconductor film 592*a* and the oxide semiconductor film 592*c* are an In-M-Zn oxide film (M represents Ga, Y, Zr, La, Ce, or Nd) and a target having the atomic ratio of metal elements of $=x_2:y_2:z_2$ is used for forming the oxide semiconductor films 592*a* and 592*c*, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 592*a* and 592*c*. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 592*a* and the oxide semiconductor film 592*c* each have a thickness of more than or equal to 3 nm and less than or equal to 100 nm, preferably more than or equal to 3 nm and less than or equal to 50 nm. The thickness of the oxide semiconductor film 592*b* is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 592*a* to 592*c* can be either amorphous or crystalline. Note that the oxide semiconductor film 592*b* in which a channel region is formed preferably has a crystalline structure, in which case the transistor 590 can have stable electrical characteristics.

Note that a channel formation region refers to a region of a semiconductor film of the transistor 590 that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 592*a* and 592*c*, the oxide semiconductor films 592*a* and 592*c* can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 592*b* is a CAAC-OS film, the oxide semiconductor film 592*b* is preferably deposited with the use of a polycrystalline target containing an In—Ga—Zn oxide (In:Ga:Zn=1:1:1 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 592*a* to 592*c* can be formed by a sputtering method, they may be formed by another method, e.g., a thermal CVD method. A metal organic chemical vapor deposition (MOCVD) method or an atomic layer deposition (ALD) method may be employed as an example of a thermal CVD method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off state current of a transistor having a channel formation region in a highly purified oxide semiconductor film. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charges of the capacitor per unit time. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 590, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 590, achieving the high-speed operation of a semiconductor device using the transistor 590.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr, Cu, Ta, Ti, Mo, and W.

Furthermore, in the case where the semiconductor film including the stacked oxide semiconductor films is used in the transistor 590, the n-type region preferably extends to the oxide semiconductor film 592b serving as a channel region in order that the mobility and on-state current of the transistor 590 can be further increased and the semiconductor device can operate at higher speed.

The insulating film 591 preferably has a function of supplying part of oxygen to the oxide semiconductor films 592a to 592c by heating. It is preferable that the number of defects in the insulating film 591 be small, and typically the spin density at g=2.001 due to a dangling bond of silicon be lower than or equal to $1\times10^{18}$ spins/cm$^3$. The spin density is measured by electron spin resonance (ESR) spectroscopy.

The insulating film 591, which has a function of supplying part of oxygen to the oxide semiconductor films 592a to 592c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 591 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 590 illustrated in FIGS. 6A to 6C or FIGS. 7A to 7C, the conductive film 596 overlaps with end portions of the oxide semiconductor film 592b including a channel region that do not overlap with the conductive films 593 and 594, i.e., end portions of the oxide semiconductor film 592b that are in a region different from a region where the conductive films 593 and 594 are located. When the end portions of the oxide semiconductor film 592b are exposed to plasma by etching for forming the end portions, a chlorine radical, a fluorine radical, or other radicals generated from an etching gas are easily bonded to a metal element contained in an oxide semiconductor. For this reason, it can be considered that, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 596 because the end portions of the oxide semiconductor film 592b that do not overlap with the conductive films 593 and 594 overlap with the conductive film 596 in the transistor 590 illustrated in FIGS. 6A to 6C or FIGS. 7A to 7C. Consequently, current that flows between the conductive films 593 and 594 through the end portions of the oxide semiconductor film 592b can be controlled by the potential applied to the conductive film 596. Such a structure of the transistor 590 is referred to as a surrounded channel (s-channel) structure.

With the s-channel structure, specifically when a potential at which the transistor 590 is turned off is supplied to the conductive film 596, the amount of off-state current that flows between the conductive films 593 and 594 through the end portions can be reduced. For this reason, in the transistor 590, even when the distance between the conductive films 593 and 594 at the end portions of the oxide semiconductor film 592b is reduced as a result of reducing the channel length to obtain high on-state current, the transistor 590 can have low off-state current. Consequently, with the short channel length, the transistor 590 can have high on-state current when in an on state and low off-state current when in an off state.

With the s-channel structure, specifically, when a potential at which the transistor 590 is turned on is supplied to the conductive film 596, the amount of current that flows between the conductive films 593 and 594 through the end portions of the oxide semiconductor film 592b can be increased. The current contributes to an increase in the field-effect mobility and an increase in the on-state current of the transistor 590. When the end portions of the oxide semiconductor film 592b overlap with the conductive film 596, carriers flow in a wide region of the oxide semiconductor film 592b without being limited to a region in the vicinity of the interface between the oxide semiconductor film 592b and the insulating film 595, which results in an increase in the amount of carrier movement in the transistor 590. As a result, the on-state current of the transistor 590 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

A structure of an oxide semiconductor film is described below.

An oxide semiconductor film is classified roughly into a single crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

On the other hand, according to a TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray beam is incident on a sample in a direction substantially perpendicular to the c-axis, a peak appears frequently when 2θ is around 56°. This peak is derived from the (110) plane of the $InGaZnO_4$ crystal. Here, analysis (ϕ scan) is performed under conditions where the sample is rotated around a normal vector of a sample surface as an axis (ϕ axis) with 2θ fixed at around 56°. In the case where the sample is a single crystal oxide semiconductor film of $InGaZnO_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added may be changed, and the degree of crystallinity in the CAAC-OS film might vary depending on regions.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

With the use of the CAAC-OS film in a transistor, variation in the electrical characteristics of the transistor due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the sputtered particle is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 2:1:3, or 3:1:2. The kinds of powders and the molar ratio for mixing powders may be determined as appropriate depending on the desired target. A CAAC-OS film formed using a target with a molar ratio of In:Ga:Zn=2:1:3 can have a particularly high proportion of regions where a diffraction pattern of CAAC-OS is observed in a predetermined area (also referred to as proportion of CAAC); thus, a transistor having a channel formation region in this CAAC-OS film can have excellent frequency characteristics.

An alkali metal is not an element included in an oxide semiconductor and thus is an impurity. Likewise, an alkaline earth metal is an impurity when the alkaline earth metal is not a component of the oxide semiconductor. When an insulating film in contact with an oxide semiconductor film is an oxide, Na, among the alkali metals, diffuses into the insulating film and becomes $Na^+$. Further, in the oxide semiconductor film, Na cuts or enters a bond between metal and oxygen which are components of the oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5\times10^{16}/cm^3$ or lower, further preferably $1\times10^{16}/cm^3$ or lower, still further preferably $1\times10^{15}/cm^3$ or lower. Similarly, the measurement value of a Li concentration is preferably $5\times10^{15}/cm^3$ or lower, further preferably $1\times10^{15}/cm^3$ or lower. Similarly, the measurement value of a K concentration is preferably $5\times10^{15}/cm^3$ or lower, further preferably $1\times10^{15}/cm^3$ or lower.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electrical characteristics of the transistor are likely to deteriorate as in the case of using an alkali metal or an alkaline earth metal. Thus, the concentrations of silicon and carbon in the oxide semiconductor film are preferably low. Specifically, the carbon concentration or the silicon concentration measured by secondary ion mass spectrometry is $1\times10^{18}/cm^3$ or lower. In this case, the deterioration of the electrical characteristics of the transistor can be prevented, so that the reliability of a semiconductor device can be improved.

<Example of Cross-Sectional Structure of Semiconductor Device>

Figure 8:
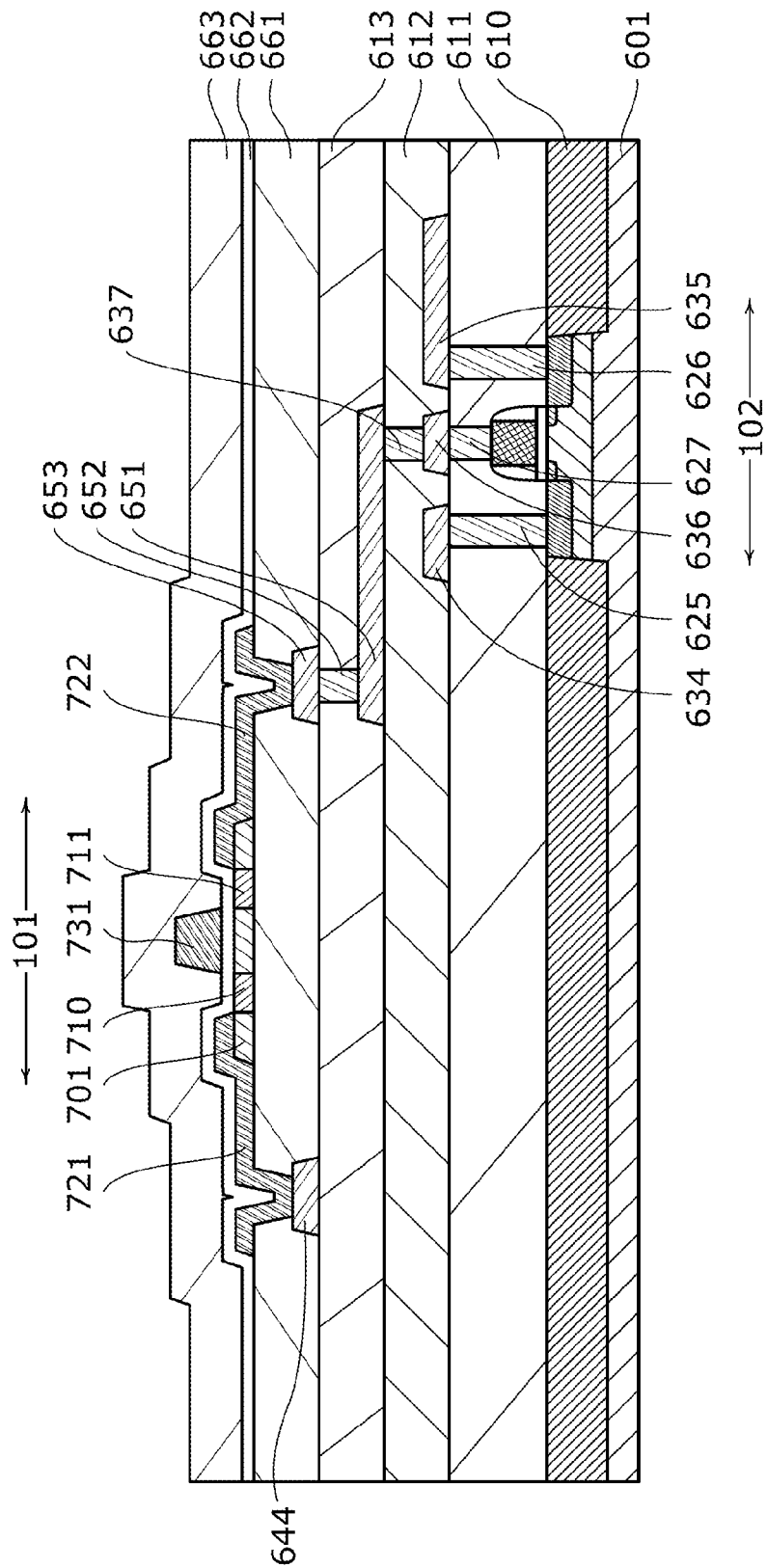
FIG. 8 illustrates a cross-sectional structure of a semiconductor device.

FIG. 8 illustrates an example of a cross-sectional structure of a semiconductor device 810 including the programmable switch PS_1,1 in FIG. 2.

In FIG. 8, the OS transistor 101 including a channel formation region in an oxide semiconductor film is formed over the transistor 102 including a channel formation region in a single crystal silicon substrate.

The transistor 102 may include the channel formation region in a semiconductor film or a semiconductor substrate of silicon, germanium, or the like in an amorphous, microcrystalline, polycrystalline, or single crystal state. Alternatively, the transistor 102 may include the channel formation region in an oxide semiconductor film or an oxide semiconductor substrate. In the case where the transistors each include a channel formation region in an oxide semiconductor film or an oxide semiconductor substrate, the OS transistor 101 is not necessarily stacked over the transistor 102, and the OS transistor 101 and the transistor 102 may be formed in the same layer.

In the case where the transistor 102 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 601 where the transistor 102 is formed can be, for example, a silicon substrate, a germanium substrate, or a silicon germanium substrate. In FIG. 8, a single crystal silicon substrate is used as the substrate 601.

The transistor 102 is electrically isolated by an element isolation method. As the element isolation method, a selective oxidation method (a local oxidation of silicon (LOCOS) method), a trench isolation method (a shallow trench isolation (STI) method), or the like can be used. FIG. 8 illustrates an example where the trench isolation method is used to electrically isolate the transistor 102. Specifically in FIG. 8, the transistor 102 is electrically isolated by element isolation using an element isolation region 610 formed in such a manner that an insulator including silicon oxide or the like is buried in a trench formed in the semiconductor substrate 601 by etching or the like.

An insulating film 611 is provided over the transistor 102. Openings are formed in the insulating film 611. Conductive films 625 and 626 that are electrically connected to the source and the drain of the transistor 102 and a conductive film 627 that is electrically connected to the gate of the transistor 102 are formed in the openings.

The conductive film 625 is electrically connected to a conductive film 634 formed over the insulating film 611. The conductive film 626 is electrically connected to a conductive film 635 formed over the insulating film 611. The conductive film 627 is electrically connected to a conductive film 636 formed over the insulating film 611.

An insulating film 612 is formed over the conductive films 634 and 635. An opening is formed in the insulating film 612. A conductive film 637 electrically connected to the conductive film 636 is formed in the opening. The conductive film 637 is electrically connected to a conductive film 651 formed over the insulating film 612.

An insulating film 613 is formed over the conductive film 651. An opening is formed in the insulating film 613. A conductive film 652 electrically connected to the conductive film 651 is formed in the opening. The conductive film 652 is electrically connected to a conductive film 653 formed over the insulating film 613. A conductive film 644 is formed over the insulating film 613.

An insulating film 661 is formed over the conductive film 653 and the conductive film 644. In FIG. 8, the OS transistor 101 is formed over the insulating film 661.

The OS transistor 101 includes, over the insulating film 661, a semiconductor film 701 including an oxide semiconductor, conductive films 721 and 722 functioning as source and drain electrodes over the semiconductor film 701, a gate insulating film 662 over the semiconductor film 701 and the conductive films 721 and 722, and a gate electrode 731 overlapping with the semiconductor film 701 over the gate insulating film 662 and between the conductive films 721 and 722. Note that the conductive film 722 is electrically connected to the conductive film 653 in the opening formed in the insulating film 661.

In the semiconductor film 701 of the OS transistor 101, there is a region 710 between a region overlapping with the conductive film 721 and a region overlapping with the gate electrode 731. In addition, in the semiconductor film 701 of the OS transistor 101, there is a region 711 between a region overlapping with the conductive film 722 and the region overlapping with the gate electrode 731. When an inert gas such as argon, an impurity which imparts p-type conductivity to the semiconductor film 701, or an impurity which imparts n-type conductivity to the semiconductor film 701 is added to the regions 710 and 711 using the conductive films 721 and 722 and the gate electrode 731 as a mask, the resistivity of the regions 710 and 711 can be made lower than that of the region overlapping with the gate electrode 731 in the semiconductor film 701.

An insulating film 663 is provided over the OS transistor 101.

In FIG. 8, the OS transistor 101 has the gate electrode 731 on at least one side of the semiconductor film 701; alternatively, the OS transistor 101 may have a pair of gate electrodes with the semiconductor film 701 positioned therebetween.

In the case where the OS transistor 101 has a pair of gate electrodes with the semiconductor film 701 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 8, the OS transistor 101 has a single-gate structure where one channel formation region corresponding to one gate electrode 731 is provided. However, the OS transistor 101 may have a multi-gate structure where a plurality of electrically connected gate electrodes are provided so that a plurality of channel formation regions are included in one active layer.

This embodiment can be implemented in appropriate combinations with any of the other embodiments.

Embodiment 7

Examples of Electronic Device

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 9A to 9F illustrate specific examples of these electronic devices.

FIG. 9A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 9A has the two display portions 5003 and 5004, the number of display portions included in a portable game machine is not limited to this.

FIG. 9B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

FIG. 9C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

FIG. 9D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

FIG. 9E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

FIG. 9F illustrates a passenger car including a car body 5101, wheels 5102, a dashboard 5103, lights 5104, and the like. The semiconductor device of one embodiment of the present invention can be used for a variety of integrated circuits included in passenger cars.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values or the like is described, the range may be freely narrowed or a value in the range may be excluded, so that one embodiment of the invention can be specified by a range part of which is excluded. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, the description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, the description "a voltage is preferably 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, the description "a film is an insulating film" is given to describe a property of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a layered film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the embodiment of the invention. For example, in the case of a transmission and reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission and reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the invention is clear. Moreover, it can be determined that one embodiment of the invention in which a function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) to constitute one embodiment of the invention. For another example, it is possible to take out M layers (M is an integer, where M<N) from a cross-sectional view in which N layers (N is an integer) are provided, to constitute one embodiment of the invention. For another example, it is possible to take out M elements (M is an integer, where M<N) from a flow chart in which N elements (N is an integer) are provided, to constitute one embodiment of the invention. For another example, it is possible to take out some given elements from a sentence "A includes B, C, D, E, or F" to constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the invention is clear.

This embodiment can be implemented in appropriate combinations with any of the other embodiments.

This application is based on Japanese Patent Application serial no. 2014-049710 filed with Japan Patent Office on Mar. 13, 2014 and Japanese Patent Application serial no.

2014-049711 filed with Japan Patent Office on Mar. 13, 2014, the entire contents of which are hereby incorporated by reference.

What is claimed is:

1. A method for operating a programmable logic device, wherein the programmable logic device comprises a first signal line, a second signal line, a programmable logic element, and a programmable switch,
wherein the programmable switch comprises a first transistor and a second transistor,
wherein one of a source and a drain of the first transistor is electrically connected to a gate of the second transistor,
wherein a channel formation region of the first transistor comprises an oxide semiconductor,
wherein the second signal line is electrically connected to one of a source and a drain of the second transistor and an output of the programmable logic element, and
wherein the first signal line is electrically connected to a gate of the first transistor, the method comprising the steps of:
setting a signal for the first signal line at a high level; and
keeping the signal for the first signal line at the high level until a signal from the output of the programmable logic element to the second signal line becomes a low level at least once after the setting of the signal for the first signal line when high data is stored to the programmable switch.

2. The method for operating a programmable logic device according to claim 1,
wherein the programmable logic device comprises a driver circuit,
wherein the driver circuit comprises a data signal line, a first latch circuit, and a second latch circuit,
wherein the first latch circuit is capable of receiving a signal from the data signal line,
wherein the second latch circuit is capable of receiving a signal from the first latch circuit, and
wherein the second latch circuit is capable of outputting the signal from the first latch circuit to the gate of the second transistor through the first transistor,
the method comprising the step of:
stopping the first latch circuit from receiving the signal from the data signal line and stopping the second latch circuit from receiving the signal from the first latch circuit after the setting of the signal for the first signal line.

3. The method for operating a programmable logic device according to claim 1,
wherein the programmable logic device comprises a driver circuit,
wherein the driver circuit comprises a data signal line, a first latch circuit, and a second latch circuit,
wherein the first latch circuit is capable of receiving a signal from the data signal line,
wherein the second latch circuit is capable of receiving a signal from the first latch circuit, and
wherein the second latch circuit is capable of outputting the signal from the first latch circuit to the gate of the second transistor through the first transistor,
the method comprising the step of:
stopping the second latch circuit from receiving the signal from the first latch circuit and making the first latch circuit receive the signal from the data signal line after the setting of the signal for the first signal line.

4. The method for operating a programmable logic device according to claim 1,
wherein the programmable logic device comprises a logic element, and
wherein the programmable switch is capable of controlling electrical connection between the second signal line and the logic element.

5. A method for operating a programmable logic device, wherein the programmable logic device comprises a first signal line, a second signal line, a programmable logic element, and a programmable switch,
wherein the programmable switch comprises a first transistor and a second transistor,
wherein one of a source and a drain of the first transistor is electrically connected to a gate of the second transistor,
wherein a channel formation region of the first transistor comprises an oxide semiconductor,
wherein the second signal line is electrically connected to one of a source and a drain of the second transistor and an output of the programmable logic element, and
wherein the first signal line is electrically connected to a gate of the first transistor,
the method comprising the steps of:
setting a signal for the first signal line at a high level; and
forcibly setting a signal for the second signal line at a low level when a signal from the output of the programmable logic element to the second signal line does not become the low level even once within a first time after the setting of the signal for the first signal line when high data is stored to the programmable switch.

6. The method for operating a programmable logic device according to claim 5,
wherein the programmable logic device comprises a driver circuit,
wherein the driver circuit comprises a data signal line, a first latch circuit, and a second latch circuit,
wherein the first latch circuit is capable of receiving a signal from the data signal line,
wherein the second latch circuit is capable of receiving a signal from the first latch circuit, and
wherein the second latch circuit is capable of outputting the signal from the first latch circuit to the gate of the second transistor through the first transistor,
the method comprising the step of:
stopping the first latch circuit from receiving the signal from the data signal line and stopping the second latch circuit from receiving the signal from the first latch circuit after the setting of the signal for the first signal line.

7. The method for operating a programmable logic device according to claim 5,
wherein the programmable logic device comprises a driver circuit,
wherein the driver circuit comprises a data signal line, a first latch circuit, and a second latch circuit,
wherein the first latch circuit is capable of receiving a signal from the data signal line,
wherein the second latch circuit is capable of receiving a signal from the first latch circuit, and
wherein the second latch circuit is capable of outputting the signal from the first latch circuit to the gate of the second transistor through the first transistor, the method comprising the step of:
  stopping the second latch circuit from receiving the signal from the first latch circuit and making the first latch circuit receive the signal from the data signal line after the setting of the signal for the first signal line.

8. The method for operating a programmable logic device according to claim 5,
  wherein the programmable logic device comprises a logic element, and
  wherein the programmable switch is capable of controlling electrical connection between the second signal line and the logic element.

9. A method for operating a programmable logic device,
  wherein the programmable logic device comprises a first signal line, a second signal line, a programmable logic element, and a programmable switch,
  wherein the programmable switch comprises a first transistor and a second transistor,
  wherein one of a source and a drain of the first transistor is electrically connected to a gate of the second transistor,
  wherein a channel formation region of the first transistor comprises an oxide semiconductor,
  wherein the second signal line is electrically connected to one of a source and a drain of the second transistor and an output of the programmable logic element, and
  wherein the first signal line is electrically connected to a gate of the first transistor,
  the method comprising the steps of:
    setting a signal for the first signal line at a high level; and
    keeping the signal for the first signal line at the high level until a total time that a signal from the output of the programmable logic element to the second signal line is at a low level exceeds a second time after the setting of the signal for the first signal line when high data is stored to the programmable switch.

10. The method for operating a programmable logic device according to claim 9,
  wherein the programmable logic device comprises a driver circuit,
  wherein the driver circuit comprises a data signal line, a first latch circuit, and a second latch circuit,
  wherein the first latch circuit is capable of receiving a signal from the data signal line,
  wherein the second latch circuit is capable of receiving a signal from the first latch circuit, and
  wherein the second latch circuit is capable of outputting the signal from the first latch circuit to the gate of the second transistor through the first transistor,
  the method comprising the step of:
    stopping the first latch circuit from receiving the signal from the data signal line and stopping the second latch circuit from receiving the signal from the first latch circuit after the setting of the signal for the first signal line.

11. The method for operating a programmable logic device according to claim 9,
  wherein the programmable logic device comprises a driver circuit,
  wherein the driver circuit comprises a data signal line, a first latch circuit, and a second latch circuit,
  wherein the first latch circuit is capable of receiving a signal from the data signal line,
  wherein the second latch circuit is capable of receiving a signal from the first latch circuit, and
  wherein the second latch circuit is capable of outputting the signal from the first latch circuit to the gate of the second transistor through the first transistor,
  the method comprising the step of:
    stopping the second latch circuit from receiving the signal from the first latch circuit and making the first latch circuit receive the signal from the data signal line after the setting of the signal for the first signal line.

12. The method for operating a programmable logic device according to claim 9,
  wherein the programmable logic device comprises a logic element, and
  wherein the programmable switch is capable of controlling electrical connection between the second signal line and the logic element.

* * * * *